(12) United States Patent
Dehlink et al.

(10) Patent No.: US 8,711,981 B2
(45) Date of Patent: Apr. 29, 2014

(54) INTEGRATED TESTING CIRCUITRY FOR HIGH-FREQUENCY RECEIVER INTEGRATED CIRCUITS

(75) Inventors: Bernhard Dehlink, Unterhaching (DE); Ralf Reuter, Munich (DE)

(73) Assignee: Freescale Semiconductor, Inc., Austin, TX (US)

(*) Notice: Subject to any disclaimer, the term of this patent is extended or adjusted under 35 U.S.C. 154(b) by 301 days.

(21) Appl. No.: 13/054,358

(22) PCT Filed: Jul. 17, 2008

(86) PCT No.: PCT/IB2008/052877
§ 371 (c)(1),
(2), (4) Date: Jan. 14, 2011

(87) PCT Pub. No.: WO2010/007473
PCT Pub. Date: Jan. 21, 2010

(65) Prior Publication Data
US 2011/0122936 A1 May 26, 2011

(51) Int. Cl.
*H03K 9/00* (2006.01)
(52) U.S. Cl.
USPC .......................................................... 375/316
(58) Field of Classification Search
USPC .................................................. 375/296, 316
See application file for complete search history.

(56) References Cited

U.S. PATENT DOCUMENTS

| | | | |
|---|---|---|---|
| 5,185,585 A * | 2/1993 | Newell et al. | 331/46 |
| 6,097,765 A * | 8/2000 | Corrigan et al. | 375/305 |
| 6,427,222 B1 | 7/2002 | Shau | |
| 7,109,730 B2 | 9/2006 | Slupsky | |
| 2002/0171410 A1 * | 11/2002 | Akahane et al. | 324/76.49 |
| 2003/0043887 A1 * | 3/2003 | Hudson | 375/144 |
| 2004/0047284 A1 * | 3/2004 | Eidson | 370/203 |
| 2005/0026579 A1 | 2/2005 | Yoneu | |
| 2005/0243948 A1 * | 11/2005 | Baker et al. | 375/303 |
| 2005/0249266 A1 * | 11/2005 | Brown et al. | 375/133 |

(Continued)

OTHER PUBLICATIONS

Saverio Trotta et al: "Design Considerations for Low-Noise, Highly-Linear Millimeter-Wave Mixers in SiGe Bipolar Technology" 33rd European Solid State Circuits Conference, 2007, ESSCIRC, IEEE, PI, Sep. 1, 2007, pp. 356-359.
Valdez-Garcia Alberto et al: "A CMOS RF RMS Detector for Built-in Testing of Wireless Transceivers" Proceedings of the 23rd IEEE VLSI Test Symposium, VTS'05, pp. 1-6.

(Continued)

*Primary Examiner* — Erin File (57) ABSTRACT

An integrated circuit comprises a receiver and an oscillator circuit. The receiver has a first input port for receiving a first oscillatory input signal, a second input port for receiving a second oscillatory input signal, and an output port for delivering an oscillatory output signal which is a function of both the first input signal and the second input signal. The oscillator circuit has a first output port for delivering a first oscillatory signal, and a second output port for delivering a second oscillatory signal. The first output port of the oscillator circuit is coupled to the HF port, and the second output port of the oscillator circuit is coupled to the LO port. The integrated circuit may be designed such that the HF port may be disconnected from the first output port of the oscillator circuit without affecting the operability of the receiver. An apparatus for testing the proper functioning of an integrated circuit as described above and a method of producing a receiver are also disclosed. The method may facilitate testing a receiver die during production. In particular it may avoid the need for feeding high-frequency signals from an external apparatus to the die.

19 Claims, 3 Drawing Sheets

(56) References Cited

U.S. PATENT DOCUMENTS

| | | | |
|---|---|---|---|
| 2006/0280114 A1* | 12/2006 | Osseiran et al. | 370/208 |
| 2007/0258510 A1* | 11/2007 | Des Noes et al. | 375/147 |
| 2009/0286500 A1* | 11/2009 | Stengel | 455/318 |
| 2010/0112961 A1* | 5/2010 | Cook et al. | 455/76 |
| 2010/0260288 A1* | 10/2010 | Aoki et al. | 375/296 |

OTHER PUBLICATIONS

Dehlink Bernhard et al: "Die-Level Production Test Concept for Radio-Frequency and Millimeter-Wave Receivers" RF/IF Innovation Center, TSO-EMEA, Dec. 4, 2007, pp. 1-4.

International Search Report and Written Opinion correlating to PCT/IB2008/052877 dated May 19, 2009.

\* cited by examiner

INTEGRATED TESTING CIRCUITRY FOR HIGH-FREQUENCY RECEIVER INTEGRATED CIRCUITS

FIELD OF THE INVENTION

This invention relates to an integrated circuit, comprising a receiver and an oscillator circuit.

The invention also relates to an apparatus for testing the proper functioning of an integrated circuit, the integrated circuit comprising a receiver and an oscillator circuit.

The invention further relates to a method of producing a receiver.

BACKGROUND OF THE INVENTION

Modern high frequency receivers, as used for example in radio, television, telecommunication and automotive radar applications, generally comprise a heterodyne or homodyne receiver for down-converting the received high frequency (HF) signal to an intermediate frequency (IF) by mixing the HF signal with a local oscillator signal generated by a local oscillator (LO). While the frequency of the received HF signal may be in the range of a few kilohertz (kHz) up to hundreds of gigahertz (GHz), the intermediate frequency typically has a fixed value in a range from close to 0 Hz to about 100 megahertz (MHz). A first benefit of the down-conversion is that the signal at the intermediate frequency may be processed more easily, in particular if the frequency of the received signal is higher than approximately 1 GHz. Secondly, a particular frequency component of the received HF signal may be selected by varying the frequency of the local oscillator until the resulting intermediate frequency matches a predetermined frequency. The circuitry for processing the intermediate frequency signal can thus be optimized for the predetermined frequency.

Heterodyne or homodyne receivers are produced on mass scale in the form of integrated circuits. Hundreds or even thousands of identical copies of the same receiver can be produced on a single slice (wafer) of a semiconductor substrate, e.g. using masking techniques. Individual receivers are obtained in a subsequent dicing process by cutting the wafer into dice, each die carrying a single receiver. In a subsequent step, each die is tested for its proper functioning, either by testing the bare die or a device in which the die has been incorporated. Usually a small percentage of dice, typically in the range of a few ppm to a few percent, are found to be faulty and are singled out. The testing procedure generally involves applying high frequency probe signals to the receiver on the die to be tested and measuring the receivers response. However, testing the performance of integrated circuits that operate at high frequencies drastically increases production costs. The biggest impact arises from the use of the high frequency probes, since today's probes are suited for laboratory use only. Furthermore, feeding a high frequency signal to a die is nontrivial as the signal can be very sensitive to the characteristics of the conductors or transmission lines that are employed and to parameters which are difficult to control, such as impedance values of contact pads. Therefore the testing methods employed today are either expensive or not sufficiently reliable. This is particularly problematic in the field of radar applications such as 77 GHz automotive radar circuits, where a failure rate close to zero ppm is required.

SUMMARY OF THE INVENTION

The present invention provides an integrated circuit, an apparatus, and a method as described in the accompanying claims.

Specific embodiments of the invention are set forth in the dependent claims.

These and other aspects of the invention will be apparent from and elucidated with reference to the embodiments described hereinafter.

Further details, aspects and embodiments of the invention will be described, by way of example only, with reference to the drawings. Elements in the figures are illustrated for simplicity and clarity and have not necessarily been drawn to scale. Identical, similar or analogous components appearing in different figures are labelled using the same reference numerals and are not necessarily described more than once.

DETAILED DESCRIPTION OF THE PREFERRED EMBODIMENTS

Figure 1:
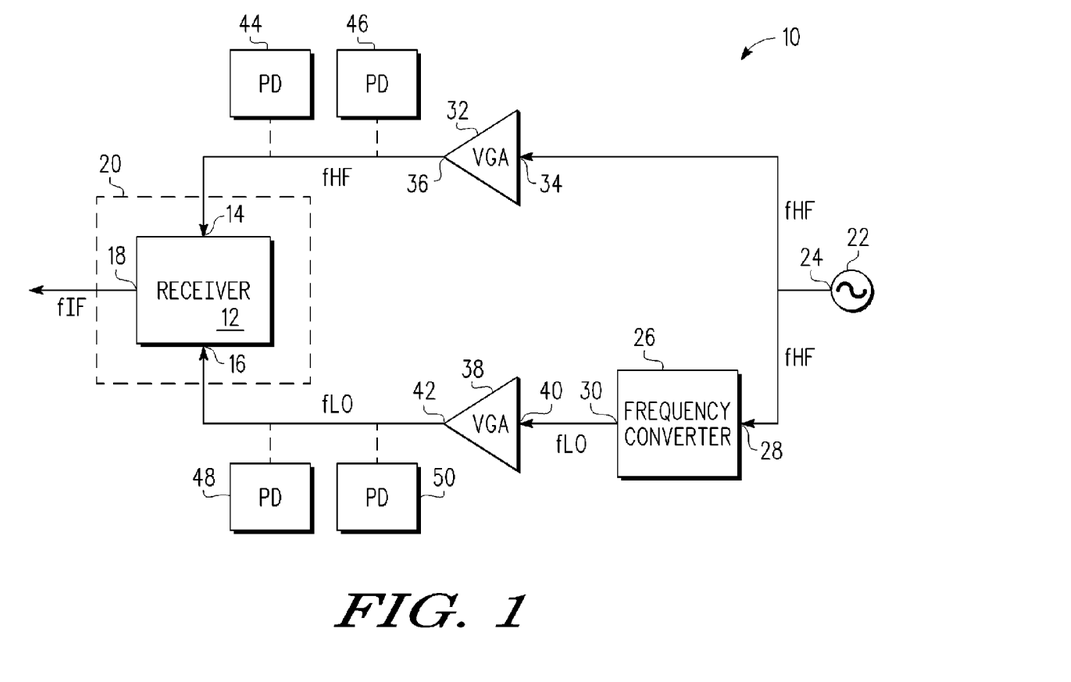
FIG. 1 schematically shows an example of an embodiment of an integrated circuit comprising a receiver and an oscillator circuit for generating a high frequency test signal.

FIG. 1 schematically shows an example of an embodiment of an integrated circuit 10 on a wafer. The integrated circuit 10 comprises a receiver 12 and an oscillator circuit 22, 26, 32, 38. The receiver 12 has a first input port (HF port) 14 for receiving a first oscillatory input signal, a second input port (LO port) 16 for receiving a second oscillatory input signal, and an output port 18 for delivering an oscillatory output signal (IF signal) which is a function of both the first input signal and the second input signal. The oscillator circuit 22, 26, 32, 38 has a first output port 36 for delivering a first oscillatory signal (HF signal), and a second output port 42 for delivering a second oscillatory signal (LO signal). Herein it is understood that the oscillator circuit 22, 26, 32, 38 is capable of generating both the HF signal and the LO signal. The first output port 36 of the oscillator circuit is coupled to the HF port 14, while the second output port 42 of the oscillator circuit is coupled to the LO port 16. Thus the HF signal can be generated on the same die or wafer that also carries the receiver 12, and it may be used for testing the receiver 12 without feeding the HF signal to the receiver 12 from an external apparatus (not shown). The frequency of the IF signal may be lower than the frequency of the HF signal. For example, the HF signal may have a frequency $f_{HF}$ above 1 GHz while the IF signal has a frequency $f_{IF}$ below 100 MHz. In the example shown, the oscillator circuit further comprises a first detector 44 for measuring the power or amplitude of the HF signal transmitted to the HF port 14. In this example, the oscillator circuit also comprises a second detector 46 for measuring the power or amplitude of that part of the HF signal that is reflected from the HF port 14. The dotted lines indicate that the detector 44 and the detector 46 are coupled to the conductor joining the oscillator circuit's port 36 to the HF port 14, for example by means of a so called rat race coupler, or by any other suitable arrangement of directional couplers. In the example shown, the oscillator circuit further comprises a third detector 48 for measuring the power or amplitude of the LO signal transmitted to the LO port 16. In this example, the oscillator circuit further comprises a fourth detector 50 for measuring the power or amplitude of that part of the LO signal that is reflected from the LO port 16. As indicated by the dotted lines, the detectors 48 and 50 are both coupled to a conductor joining the output port 42 to the LO port 16, for example by means of a rat race coupler, analogously to the arrangement of detectors 44 and 46 mentioned above. In the example shown, the oscillator circuit comprises an oscillator 22 having an output port 24 for delivering an oscillatory oscillator signal. The oscillators output port 24 is coupled to the HF port 14 and to the LO port 16. The oscillator circuit further comprises an amplifier 32 having an input port 34 for receiving an input signal, and an output port 36 for delivering an output signal that is essentially proportional to the input signal. The output port 24 of the oscillator 22 is coupled to the input port 34 of the amplifier 32. The output port 36 of the amplifier 32 is coupled to the HF port 14. The amplifier 32 may be a variable gain amplifier, in which case its gain or its output power may be varied, e.g. by varying an external DC voltage applied to a control port (not shown) of the amplifier 32. The oscillator circuit further comprises a second amplifier 38 having an input port 40 for receiving an input signal, and an output port 42 for delivering an output signal that is essentially proportional to the input signal. The output port 24 of the oscillator 22 is coupled to the input port 40 of the second amplifier 38. The output port 42 of the second amplifier 38 is coupled to the LO port 16. The second amplifier 38 may be a variable gain amplifier, as described above with reference to the first amplifier 32. In the example shown, the oscillator circuit further comprises a frequency converter 26 having an input port 28 for receiving an input signal, and an output port 30 for delivering an output signal having a frequency which differs from the frequency of the input signal, for example by an offset of between 10 kHz and 10 MHz. The output port 24 of the oscillator 22 is coupled to the input port 28 of the frequency converter 26. The output port 30 of the frequency converter 26 is coupled to the LO port 16 (in the example shown, additional elements are coupled between the output port 30 and the LO port 16). The circuit 10 thus allows feeding to the receivers HF port 14 and to its LO port 16 respectively a high frequency signal at frequency $f_{HF}$ and a high frequency signal at frequency $f_{LO}$ in order to simulate the input signals which during normal operation of the receiver 12 would be received from an antenna and generated by a local oscillator, respectively. The oscillator 22 may in particular be a voltage controlled oscillator (VCO). In this case the generated frequency $f_{HF}$ is a function of a control voltage applied to the VCO.

During operation of the device 10, the oscillator 22 generates a high frequency signal of frequency $f_{HF}$, e.g. 76.5 GHz. This signal is fed to the HF input port 14 of the receiver 12 via the amplifier 32 and a temporary conductor between the ports (or pads) 36 and 14. Another part of the output signal generated by the oscillator 22 at frequency $f_{HF}$ is fed to the frequency converter 26 which converts the signal to a frequency $f_{LO}$ which, according to an exemplary embodiment, is 5 MHz lower than the frequency $f_{HF}$ of the initial signal. The signal at frequency $f_{LO}$, which is intended to simulate a local oscillator signal, is fed to the receivers LO port 16 via the second amplifier 38 and a temporary conductor joining the amplifiers output port 42 to the receivers LO port 16.

After the receivers proper functioning has been tested by monitoring the IF signal as a function of the HF signal received at the HF port 14 and/or the LO signal received at the LO port 16, it may be desirable to separate the receiver 12 from the testing circuitry at least partially. The integrated circuit 10 may therefore be designed such that the receivers HF port 14 may be disconnected from the first output port 36 of the oscillator circuit without affecting the operability of the receiver 12. The first output port 36 of the oscillator circuit may for example be coupled to the HF port 14 via a fuse (not shown). The conductor 36-14 may thus be interrupted by blowing the fuse, for example by applying a sufficiently high voltage across the fuse. Alternatively, the coupling between the first output port 36 of the oscillator circuit and the HF port 14 may be designed such that it may be destroyed by sawing or by means of a focused ion beam (FIB) or by chemical processes. Similar means and methods may be employed to disconnect the oscillator circuit's second output port 42 from the receivers LO port 16, if desired. However, for specific applications it may be desirable to produce a die comprising the receiver 12 coupled to the local oscillator 22, 26. In that case it may be advantageous to conserve the conductor between the ports 42 and 16. In the example shown, the receiver 12 and the oscillator circuit 22, 32, 26, 38 and the power detectors 44, 46, 48, 50 are arranged in positions such that the HF port 14 may be disconnected from the first output port 36 of the oscillator circuit, without affecting the operability of the receiver 12, by cutting a die 20 out of the wafer. The die 20 comprises the receiver 12 but neither the first output port 36 nor the second output port 42 of the oscillator circuit.

It is pointed out that the system for testing the proper functioning of the receiver 12 is included on the wafer, adjacent to or surrounding the die 20 to be tested. The test system comprises the oscillator circuit 22, 26, 32, 38 which is connected to the receiver 12 by conductors that may be cut or otherwise destroyed after the receivers 12 functioning has been tested. The concept thus allows monitoring the receivers performance in production on the wafer. Using the on-chip detectors (sensors) 44, 46, 48, 50, only direct current (DC) or low frequency signals, in particular the IF signal delivered at output port 18, need to be monitored. The concept is also applicable to the case in which the device under test is a transceiver including a receiver and a frequency generator. In this case the oscillator (frequency generator) 22 and, if necessary, the frequency converter 26 may be arranged on the die 20 jointly with the receiver 12.

Still referring to FIG. 1, the receiver 12 and the oscillator circuit coupled to it may in particular be designed for radar applications, and more specifically to automotive radar systems, for being installed in motor vehicles. Such systems allow, for example, detecting road obstacles or measuring the location of other vehicles. The oscillator 22 may, for example, generate a frequency $f_{HF}$ of 76.5 GHz delivered at the output port 24. The frequency converter 26 may then convert the signal to a somewhat higher frequency $f_{LO}$ of 76.52 GHz. The frequencies $f_{HF}$ and $f_{LO}$ thus differ by 20 MHz. The signal at frequency $f_{LO}$ is amplified by the amplifier 38 and fed to the LO port 16 of the receiver 12, where it is mixed with the HF signal received at the input port 14 to generate a signal at the intermediate frequency $f_{IF}$, the intermediate frequency $f_{IF}$ being the difference between the input frequency $f_{HF}$ and the local oscillator frequency $f_{LO}$. Thus, in the present example, the intermediate frequency $f_{IF}$ delivered at the IF port 18 is 20 MHz. It is noted that various mixing schemes are possible, and the one sketched above is only an example. For example, the frequency $f_{LO}$ delivered at the output port 30 of the frequency converter 26 might as well be lower than the frequency $f_{HF}$ delivered by the oscillator 22. Furthermore, the receiver 12 may include a frequency multiplier, e.g. a frequency doubler, for doubling the frequency $f_{LO}$ of the signal received at the LO port 16 before mixing the LO signal with the HF signal received at the HF port 14. The LO signal may then for example have a frequency of 38.26 GHz.

Figure 2:
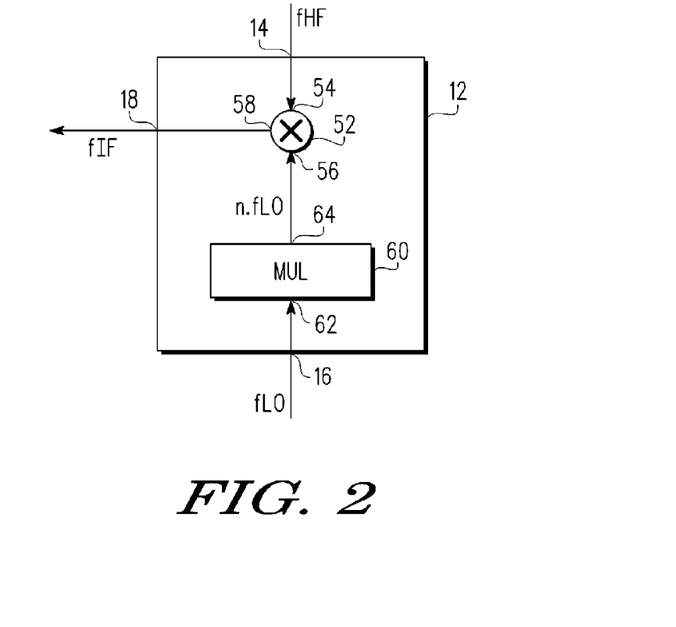
FIG. 2 schematically shows an example of an embodiment of a receiver.

Referring now to FIG. 2, there is shown, in a schematic and simplified manner, an example of a receiver 12. The receiver 12 has a first input port 14 for receiving a first oscillatory input signal, a second input port (LO port) 16 for receiving a second oscillatory input signal, and an output port 18 for delivering an oscillatory output signal (IF signal) which is a function of both the IF signal and the LO signal. The receiver 12 comprises a frequency mixer 52 having a first input port 54 for receiving a first input signal, a second input port 56 for receiving a second input signal, and an output port 58 for delivering an output signal that is essentially the product of the first input signal and the second input signal. The HF port 14 is coupled to the first input port 54 of the frequency mixer 52. The LO port 16 is coupled to the second input port 56 of the frequency mixer 52. The output port 58 of the frequency mixer 52 is coupled to the IF port 18. The signal delivered at the output port 58 may have various frequency components, notably the frequency of the first input signal, the frequency of the second input signal, the sum of the frequencies of the first and the second input signals, and the difference of the frequencies of the first and the second input signals. The receiver 12 may additionally comprise a filter between the ports 58 and 18 for delivering at the IF port 18 only a selected frequency or frequency range of the signal delivered at the frequency mixer's output port 58. In the example shown, the receiver 12 further comprises a frequency multiplier 60, having an input port 62 for receiving an input signal, and an output port 64 for delivering an output signal having a frequency that is a multiple of the frequency of the input signals. The frequency multiplier 60 may in particular be a frequency doubler for delivering at the output port 64 an output signal having a frequency that is twice the frequency of the input signal received at the input port 62. The receiver's LO port 16 is coupled to the input port 62 of the frequency multiplier 60. The output port 64 of the frequency multiplier 60 is coupled to the second input port 56 of the frequency mixer 52.

Figure 3:
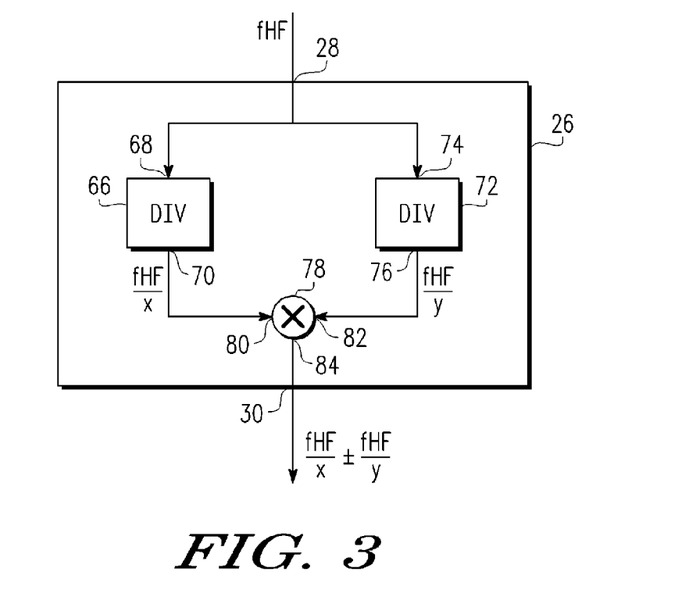
FIG. 3 schematically shows an example of an embodiment of a frequency converter.

Referring now to FIG. 3, there is shown, in a schematic and simplified manner, an example of a frequency converter 26 comprising a first frequency divider 66, a second frequency divider 72, and a frequency mixer 78. The first frequency divider 66 and the second frequency divider 72 each have an input port 68, 74 for receiving an input signal, and an output port 70, 76 for delivering an output signal having a frequency which is a fraction of the frequency of the input signal. The frequency mixer 78 has a first input port 80 for receiving a first input signal, a second input port 82 for receiving a second input signal, and an output port 84 for delivering an output signal that is essentially the product of the first input signal and the second input signal. The input port 28 of the frequency converter 26 is coupled to the input port 68 of the first frequency divider 66 and to the input port 74 of the second frequency divider 72. The output port 70 of the first frequency divider 66 is coupled to the first input port 80 of the frequency divider 78. The output port 76 of the second frequency divider 72 is coupled to the second input port 82 of the frequency mixer 78. The output port 84 of the frequency mixer 78 is coupled to the output port 30 of the frequency converter 26. Let the frequency of the signal received at the input port 28 be $f_{HF}$. The first and the second frequency dividers 66 and 72 then deliver output signals having frequencies $f_{HF}/x$ and $f_{HF}/y$, respectively, where x and y are integer or rational numbers which are characteristic of the first and second frequency divider 68 and 74, respectively. The output signal delivered by the frequency mixer 78 at the output port 84 thus has frequency components including the sum and the difference of the frequencies $f_{HF}/x$ and $f_{HF}/y$. By choosing suitable values of x and y it is thus possible to generate an output signal at the output port 84 having a frequency which is offset, for example by 5 MHz or 10 MHz, relative to the frequency $f_{HF}$ of the signal received at the input port 28. A filter (not shown) may optionally be arranged between the ports 84 and 30 for transmitting for example the sum $f_{HF}/x+f_{HF}/y$ while filtering out the difference $f_{HF}/x-f_{HF}/y$.

Figure 4:
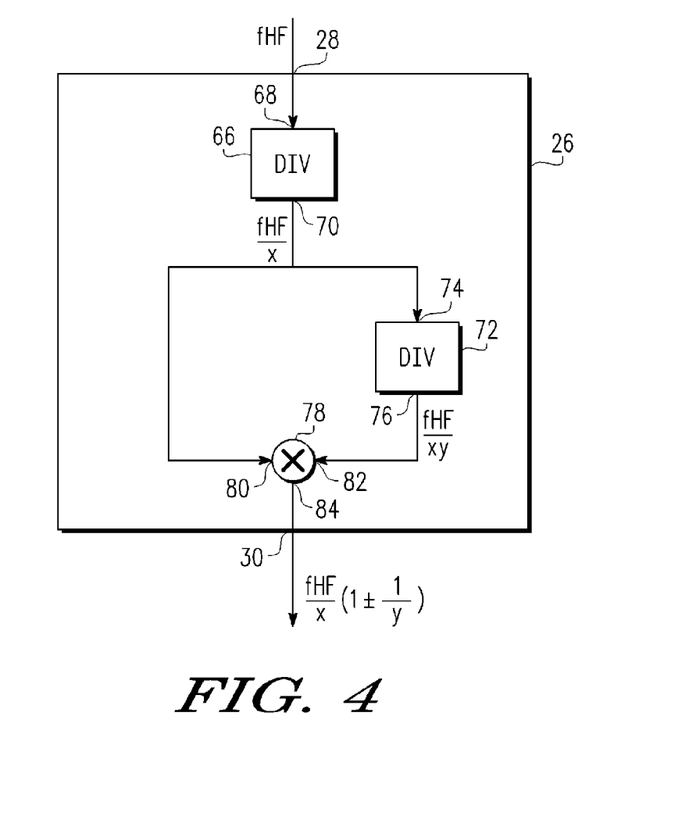
FIG. 4 schematically shows an example of another embodiment of a frequency converter.

Turning now to FIG. 4, there is shown in a schematic and simplified manner a second example of a frequency converter 26. The frequency converter 26 comprises a first frequency divider 66, a second frequency divider 72, and a frequency mixer 78. The first frequency divider 66 and the second frequency divider 72 each have an input port 68, 74 for receiving an input signal and an output port 70, 76 for delivering an output signal having a frequency that is a fraction of the frequency of the input signal. The frequency mixer 78 has a first input port 80 for receiving a first input signal, a second input port 82 for receiving a second input signal, and an output port 84 for delivering an output signal that is essentially a product of the first input signal and the second input signal. The input port 28 of the frequency converter 26 is coupled to the input port 68 of the first frequency divider 66. The output port 70 of the first frequency divider 66 is coupled to the first input port 80 of the frequency mixer 78 and to the input port 74 of the second frequency divider 74. The output port 76 of the second frequency divider 72 is coupled to the second input port 82 of the frequency mixer 78. The output port 84 of the frequency mixer 78 is coupled to the output port 30 of the frequency converter 26. The input signal received at the input port 68 of the first frequency divider 66 having a frequency $f_{HF}$, the first and the second frequency divider 68 and 72 deliver signals having respectively the frequencies $f_{HF}/x$ and $f_{HF}/xy$. The output signal delivered by the frequency mixer 78 thus has the frequency components $f_{HF}/x(1+1/y)$ and $f_{HF}/x(1-1/y)$. A filter for filtering out undesired frequency components may be provided between the mixers output port 84 and the output port 30.

Figure 5:
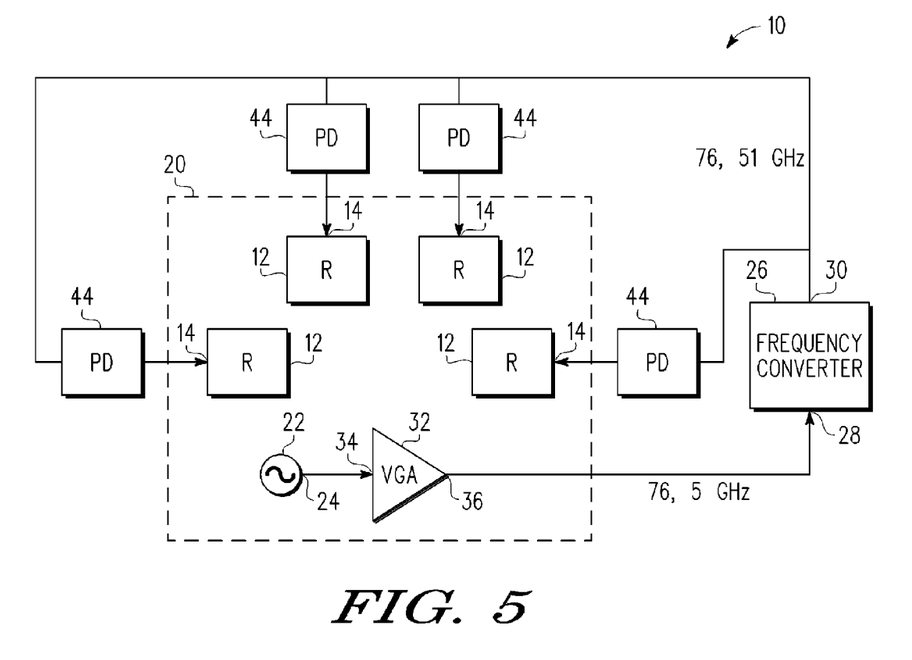
FIG. 5 schematically shows an example of an embodiment of an integrated circuit comprising a plurality of receivers and an oscillator circuit.

Referring to FIG. 5, there is shown schematically and in a simplified manner a second example of an integrated circuit 10 on a substrate. The integrated circuit 10 comprises a plurality of receivers 12 as described above in an exemplary manner with reference to FIGS. 1 and 2, and an oscillator circuit 22, 32, 26, 44. The plurality of receivers 12 may be intended for being connected, at a later production stage, to a corresponding plurality of antennas (not shown). The antennas may be arranged relative to each other such that the direction of an incident electromagnetic wave may be determined from the phase differences between signals received by different antennas. The oscillator circuit has a first output port 30 which is coupled to the HF port 14 of each receiver 12. The output port 24 of the oscillator 22 is coupled to an input port 34 of a variabale gain amplifier (VGA) 32. The VGA's output port 36 is coupled to the input port 28 of the frequency converter 26. A second VGA (not shown) may be coupled between the frequency converters output port 30 and the power detectors 44. The second VGA may in particular be necessary for measuring the compression points of the receivers 12. The oscillator circuit also has a second output port (not shown) which is coupled to the LO port (not shown) of each receiver 12. During operation of the device 10, the oscillator 22 delivers an oscillatory output signal to be amplified by the amplifier 32 and converted to another frequency by means of the frequency converter 26. The frequency dividers which may be included in the frequency converter are included on die for monitoring the oscillators frequency in regular operation. The transceiver then only needs an external mixer for generating the HF input signals. The frequency of the oscillator 22 may for example be 76.50 GHz, and the frequency of the signal output by the frequency converter 26 may for example be 76.51 GHz. In this example, the signal at 76.50 GHz is fed to the LO port of each receiver 12, while the signal at frequency 76.51 GHz is fed to the HF port 14 of each receiver 12 via a power detector (PD) 44 associated with each receiver 12. The receivers 12, the oscillator 22, and the power amplifier 32 are intended to provide the function of a transceiver for both emission and reception of signals. Accordingly, the receivers 12, the oscillator 22, and the power amplifier 32 are arranged jointly on a die 20 for being cut out of the wafer after testing the performance of the receivers 12. Each of the power detectors 44 is coupled to the input port 14 of the associated receiver 12 for measuring the power which is transmitted from the output port 30 of the frequency converter 26 to the HF port 14 of the respective receiver 12 and for measuring the power which is reflected from the HF port 14 of the respective receiver 12.

Any of the elements represented in FIGS. 1 to 5 may have additional ports which have not been shown for the sake of clarity. More specifically, each of these elements, for example the oscillator 22, the amplifiers 32 and 38, and the power detectors 44, 46, 48, 50, may have ports for being coupled to an external device for controlling these elements. For example, the oscillator 22 may have an input port for receiving a DC or low-frequency voltage determining the frequency delivered by the oscillator 22 at its output port 24. Similarly, each of the amplifiers 32, 38 may have an input port for receiving a voltage determining the gain of the amplifier, that is, the ratio of the output signal delivered by the amplifier to the input signal. The proper functioning of the integrated circuit 10 may thus be tested by means of an apparatus comprising at least one port for contacting a complementary port of the oscillator circuit, for enabling powering and/or controlling the oscillator circuit, and a detector 44 for measuring the power or amplitude of the IF signal delivered by the receiver 12. While the various elements of the integrated circuit 10, in particular the oscillator 22, the amplifiers 32 and 38, the frequency converter 26 and the power detectors 44, 46, 48, 50 are designed for processing high frequency signals, controlling these elements may be achieved by means of external control signals in the DC or low frequency domain, e.g. by means of signals having frequencies below one MHz.

Figure 6:
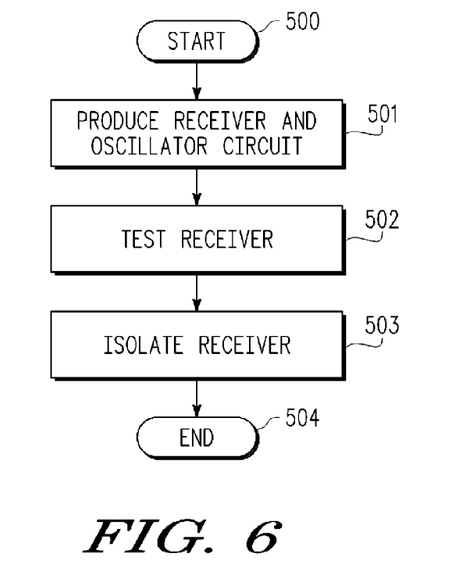
FIG. 6 is a flow chart illustrating in a simplified manner a method of producing a receiver.

Referring now to FIG. 6, there is illustrated schematically a method of producing a receiver 12. The method comprises the successive steps of producing S01 the integrated circuit 10 as described above with reference to FIGS. 1 to 5, powering S02 the oscillator circuit and measuring the power or amplitude of the IF signal delivered by the receiver, and disconnecting S03 the receivers HF port 14 from the oscillator circuit. The method starts in step S00. In the first step S01 an integrated circuit comprising a receiver and oscillator circuit is produced. In subsequent step S02 the receivers performance is tested by powering the oscillator circuit and measuring the power or amplitude of the IF signal delivered by the receiver. In the subsequent step S03 the receiver is isolated at least partially from the oscillator circuit, wherein at least the HF port 14 is disconnected from the oscillator circuit. The performance of the receiver may be characterized by the following parameters: the receivers conversion gain (CG), its noise figure (NF), its linearity, its local oscillator (LO) minimum power level, and the matching at the HF input port. The step S02 of testing the receiver may comprise determining at least one of these parameters. The method thus allows for testing the receiver in production while avoiding the need for expensive external high-frequency equipment.

The conversion gain of a receiver circuit is defined by the ratio of the power of the delivered IF signal to the power of the received HF signal, e.g. at 76.52 GHz. It may be determined as follows. The power level of the HF input signal received at the HF port of the receiver is measured by means of a power detector (PD). The ratio of the HF input power level and the IF power level then yields the conversion gain. A condition for determining the CG for weak HF signals is that the HF power level is chosen such that the receiver operates under small signal conditions.

The receivers linearity may be expressed in terms of the input-referred 1-dB compression point, the latter being defined as the signal power level at the HF input where the receivers CG is 1 dB lower compared to its CG for small signals. It may be measured in a manner similar to measuring the conversion gain. The HF input power is scanned across different values and the conversion gain is determined as a function of the HF input power. The input power level where the conversion gain has dropped by 1 dB from its small-signal value determines the 1 dB compression point.

The noise figure defines the degradation of the signal-to-noise ratio (SNR) at the output with respect to the SNR at the input of the device. The noise floor PN at the receivers IF port 18 is determined by three factors and can be expressed on a logarithmic scale as $$PN = -174 \text{ dBm} + CG + NF_{ssb}$$

where $NF_{ssb}$ represents the single sideband (SSB) noise figure of the receiver. The factor –174 dBm stems from the assumption that the HF port 14 of the receiver is power-matched to the source, i.e. to the output port 36 of the oscillator circuit and that the noise at the receivers HF port 14 is dominated by thermal noise at room temperature (290 K). This assumption is justified as the noise floor is measured at an offset frequency where e.g. phase noise of the oscillator is negligible. Knowing the conversion gain from previous measurements, the noise figure of the receiver can be determined.

The matching parameter indicates the portion of the incident HF power that is reflected from the HF port of the receiver. This parameter can be measured using a suitable configuration of power detectors 44, 46, as shown in FIG. 1. Most of the transmitted power is fed to the receiver 12 (load) via the conductor 36-14. The magnitude of the transmitted signal is measured by the power detector 44 which generates an output voltage as a function of the magnitude of the received signal. A directional coupler is used such that the part of the incident wave that is reflected by the load 12 (reflected wave) interferes destructively with itself at the first power detector 44 and hence does not contribute to the measured power. The reflected wave is coupled to the second power detector 46. At the second power detector 46 the transmitted signal interferes destructively with itself and therefore does not contribute to the measured power. The ratio of the output voltages produced respectively at the first power detector 44 and at the second power detector 46 yields the magnitude of the reflection coefficient ρ which in the present single channel case (namely, transmission from the output port 36 to the HF input port 14) is also known as the magnitude of the S-parameter $S_{11}$, defined as the ratio of the amplitude of the reflected wave versus the amplitude of the transmitted wave. Ideally, the S-parameter $S_{11}$ should be zero, corresponding to perfect transmission of the wave from the source to the load.

The minimum local oscillator (LO) power level is the minimum power of the LO signal that is required to ensure that the CG, the NF, and the 1-dB compression point assume predefined values. This power level may be determined by observing the dependence of the CG, the NF, and the 1-dB compression point on the power of the LO signal that is fed to the receivers LO port via a variable gain amplifier.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise, the connections may for example be direct connections or indirect connections. Other modifications, variations and alternatives are also possible. The specifications and drawings are, accordingly, to be regarded in an illustrative rather than in a restrictive sense.

The semiconductor substrate described herein can be any semiconductor material or combinations of materials, such as gallium arsenide, silicon germanium, silicon-on-insulator (SOI), silicon, monocrystalline silicon, the like, and combinations of the above.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa.

The ports described above may be any point or node where a signal may be received or where a signal is delivered. Thus any point in a conductor may constitute a port. The port is not necessarily physically distinguishable from any other point in the conductor.

The circuits introduced above are not necessarily closed circuits. A circuit as discussed herein is a piece of circuitry intended to form a part of a closed electronic circuit.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An integrated circuit, comprising:
   a receiver, wherein the receiver comprises
      a first input port for receiving a first oscillatory input signal,
      a second input port for receiving a second oscillatory input signal, and
      an output port for delivering an oscillatory output signal which is a function of both the first input signal and the second input signal; and
   an oscillator circuit, wherein the oscillator circuit comprises
      a first output port for delivering a first oscillatory signal,
      a second output port for delivering a second oscillatory signal, wherein
         the first output port of the oscillator circuit is coupled to the first input port of the receiver to test a function of the receiver,
         the second output port of the oscillator circuit is coupled to the second input port of the receiver, and
         the first input port of the receiver is uncoupled from the first output port of the oscillator circuit after the function of the receiver is tested; and
   at least one of:
      a first detector, for measuring the power or amplitude of the first oscillatory signal transmitted to the first input port,
      a second detector, for measuring the power or amplitude of that portion of the first oscillatory signal that is reflected from the first input port,
      a third detector, for measuring the power or amplitude of the second oscillatory signal transmitted to the second input port, and
      a fourth detector, for measuring the power or amplitude of that portion of the second oscillatory signal that is reflected from the second input port.

2. The integrated circuit as claimed in claim 1, wherein the receiver further comprises:
   a frequency mixer comprising
      a first input port for receiving a first input signal,
      a second input port for receiving a second input signal, and
      an output port for delivering an output signal that is essentially the product of the first input signal and the second input signal, wherein
         the first input port of the receiver is coupled to the first input port of the frequency mixer,
         the second input port of the receiver is coupled to the second input port of the frequency mixer, and
         the output port of the frequency mixer is coupled to the output port of the receiver.

3. The integrated circuit as claimed in claim 2, wherein the receiver further comprises:
   a frequency multiplier comprising
      an input port for receiving an input signal, and
      an output port for delivering an output signal having a frequency that is a multiple of the frequency of the input signal, wherein
         the second input port of the receiver is coupled to the input port of the frequency multiplier, and
         the output port of the frequency multiplier is coupled to the second input port of the frequency mixer.

4. The integrated circuit as claimed in claim 1 wherein the oscillator circuit further comprises:
   an oscillator having an output port for delivering the first oscillatory input signal to the first input port of the receiver and for delivering the second oscillatory input signal to the second input port of the receiver.

5. The integrated circuit as claimed in claim 4 wherein the oscillator circuit further comprises:
an amplifier comprising
an input port for receiving an input signal, and
an output port for delivering an output signal that is essentially proportional to the input signal, wherein
the output port of the oscillator is coupled to the input port of the amplifier, and
the output port of the amplifier is coupled to one or more of the first input port of the receiver and to the second input port of the receiver.

6. The integrated circuit as claimed in claim 4 wherein the oscillator circuit further comprises:
a frequency converter comprising
an input port for receiving an input signal, and
an output port for delivering an output signal having a frequency which differs from the frequency of the input signal, wherein
the output port of the oscillator is coupled to the input port of the frequency converter, and
the output port of the frequency converter is coupled to the first input port of the receiver or to the second input port of the receiver.

7. The integrated circuit as claimed in claim 6 wherein the frequency converter further comprises:
a first frequency divider;
second frequency divider; and
a frequency mixer, wherein
the first frequency divider and the second frequency divider each comprise
an input port for receiving an input signal, and
an output port for delivering an output signal having a frequency which is a fraction of the frequency of the input signal,
the frequency mixer comprises
a first input port for receiving a first input signal,
a second input port for receiving a second input signal, and
an output port for delivering an output signal that is essentially the product of the first input signal and the second input signal, wherein
the input port of the frequency converter is coupled to the input port of the first frequency divider and to the input port of the second frequency divider,
the output port of the first frequency divider is coupled to the first input port of the frequency mixer,
the output port of the second frequency divider is coupled to the second input port of the frequency mixer, and
the output port of the frequency mixer is coupled to the output port of the frequency converter.

8. The integrated circuit as claimed in claim 6, wherein the frequency converter comprises:
a first frequency divider;
a second frequency divider; and
a frequency mixer, wherein
the first frequency divider and the second frequency divider each comprising
an input port for receiving an input signal, and
an output port for delivering an output signal having a frequency that is a fraction of the frequency of the input signal, the frequency mixer comprising
a first input port for receiving a first input signal,
a second input port for receiving a second input signal, and
an output port for delivering an output signal that is essentially the product of the first input signal and the second input signal, wherein
the input port of the frequency converter is coupled to the input port of the first frequency divider,
the output port of the first frequency divider is coupled to the first input port of the frequency mixer and to the input port of the second frequency divider,
the output port of the second frequency divider is coupled to the second input port of the frequency mixer, and
the output port of the frequency mixer is coupled to the output port of the frequency converter.

9. The integrated circuit as claimed in claim 1 wherein the first output port of the oscillator circuit is connected to the first input port of the receiver via a fuse.

10. The integrated circuit as claimed in claim 9 wherein the first input port of the receiver is disconnected from the first output port of the oscillator circuit when the fuse is blown.

11. The integrated circuit as claimed in claim 1 wherein the at least one of the first detector, the second detector, the third detector, and the fourth detector comprises the first detector and the third detector.

12. An integrated circuit, comprising:
a frequency converter, wherein the frequency converter comprises
an input port, and
an output port;
a receiver, wherein the receiver comprises
a first input port for receiving a first oscillatory input signal,
a second input port for receiving a second oscillatory input signal, and
an output port for delivering an oscillatory output signal which is a function of both the first input signal and the second input signal; and
an oscillator circuit, wherein the oscillator circuit comprises
an output port for delivering an oscillatory signal, wherein
the output port of the oscillator circuit is coupled to the first input port of the receiver and to the input port of the frequency converter,
the output port of the frequency converter is coupled to the second input port of the receiver to provide the second oscillatory input signal to the receiver, and
the first input port of the receiver may be disconnected from the first output port of the oscillator circuit without affecting the operability of the receiver; and
wherein,
the first output port of the oscillator circuit is coupled to the first input port of the receiver via a fuse, or
the coupling between the first output port of the oscillator circuit and the first input port of the receiver may be destroyed by sawing or by means of a focused ion beam or by chemical processes, or
the first input port of the receiver may be disconnected from the first output port of the oscillator circuit by cutting a die out of a substrate carrying the integrated circuit, the die comprising the receiver and not comprising the first output port of the oscillator.

13. The integrated circuit as claimed in claim 12 wherein the receiver further comprises:

a frequency mixer comprising
    a first input port for receiving a first input signal,
    a second input port for receiving a second input signal, and
    an output port for delivering an output signal that is essentially the product of the first input signal and the second input signal, wherein
        the first input port of the receiver is coupled to the first input port of the frequency mixer,
        the second input port of the receiver is coupled to the second input port of the frequency mixer, and
        the output port of the frequency mixer is coupled to the output port of the receiver.

14. The integrated circuit as claimed in claim 12 wherein the oscillator circuit further comprises:
an oscillator having an output port for delivering the first oscillatory input signal to the first input port of the receiver and for delivering the first oscillatory input signal to the input port of the frequency converter.

15. An integrated circuit comprising:
a receiver, wherein the receiver comprises
    a first input port for receiving a first oscillatory input signal,
    a second input port for receiving a second oscillatory input signal, and
    an output port for delivering an oscillatory output signal which is a function of both the first input signal and the second input signal;
an oscillator circuit, wherein the oscillator circuit comprises
    a first output port for delivering a first oscillatory signal, and
    a second output port for delivering a second oscillatory signal, wherein
        the first output port of the oscillator circuit is coupled to the first input port of the receiver to test a function of the receiver,
        the second output port of the oscillator circuit is coupled to the second input port of the receiver, and
        the first input port of the receiver is uncoupled from the first output port of the oscillator circuit after the function of the receiver is tested; and
a plurality of receivers, wherein
    the plurality of receivers comprises the receiver,
    the first output port of the oscillator circuit is coupled to the first input port of each receiver of the plurality of receivers, and
    the second output port of the oscillator circuit is coupled to the second input port of each receiver of the plurality of receivers.

16. The integrated circuit as claimed in claim 15 wherein the receiver further comprises:
a frequency mixer comprising
    a first input port for receiving a first input signal,
    a second input port for receiving a second input signal, and
    an output port for delivering an output signal that is essentially the product of the first input signal and the second input signal, wherein
        the first input port of the receiver is coupled to the first input port of the frequency mixer,
        the second input port of the receiver is coupled to the second input port of the frequency mixer, and
        the output port of the frequency mixer is coupled to the output port of the receiver.

17. The integrated circuit as claimed in claim 15 wherein the oscillator circuit further comprises:
an oscillator having an output port for delivering the first oscillatory input signal.

18. A method comprising:
providing an integrated circuit including an oscillator and a receiver;
providing, at an output port of the oscillator, a first oscillatory input signal to a first input port of the receiver;
providing, at the output port of the oscillator, the first oscillatory input signal to an input port of a frequency converter;
providing, at an output port of the frequency converter, a second oscillatory input signal to a second input port of the receiver, wherein the second oscillatory input signal is based on the first oscillatory signal;
receiving, at a first input port of the receiver, the first oscillatory input signal;
receiving, at a second port of the receiver, the second oscillatory input signal; and
delivering, from an output port of the receiver, an oscillatory output signal, wherein the oscillatory output signal is a function of both the first oscillatory input signal and the second oscillatory input signal.

19. The method of claim 18, further comprising:
testing the integrated circuit, wherein the testing comprises detecting at least one of a power or an amplitude of the oscillatory output signal; and
disconnecting the second input port of the receiver from the output port of the voltage converter in response to testing the integrated circuit.

* * * * *